United States Patent [19]

Yoshida et al.

[11] Patent Number: 4,965,168

[45] Date of Patent: Oct. 23, 1990

[54] SILVER MASTER PLATE RECOVERY SOLUTION

[75] Inventors: Hajime Yoshida, Aichi; Tokuichi Kamada, Ichinomiya; Osamu Kainuma, Nagoya, all of Japan

[73] Assignee: Nikken Chemical Laboratory Co., Ltd., Nagoya, Japan

[21] Appl. No.: 361,659

[22] Filed: Jun. 2, 1989

[30] Foreign Application Priority Data

Jun. 9, 1988 [JP] Japan .................................. 63-142577

[51] Int. Cl.$^5$ .................................................. G03C 5/54
[52] U.S. Cl. ...................................... 430/204; 430/264; 430/302; 430/331; 430/463; 101/466
[58] Field of Search ............... 430/204, 264, 302, 331, 430/463; 101/466

[56] References Cited

U.S. PATENT DOCUMENTS

| | | | |
|---|---|---|---|
| 3,378,372 | 4/1968 | Vandeputte et al. | 101/466 |
| 3,819,374 | 6/1974 | Kemp | 101/466 |
| 3,832,175 | 8/1974 | Kemp | 101/466 |
| 4,358,530 | 11/1982 | Shiba | 430/302 |

FOREIGN PATENT DOCUMENTS 1271225  4/1972  United Kingdom .

*Primary Examiner*—Paul R. Michl
*Assistant Examiner*—Hoa V. Le
*Attorney, Agent, or Firm*—Spencer & Frank

[57] ABSTRACT

A silver master plate recovery solution for a silver salt photographic plate for offset printing is disclosed which comprises (a) a hydrazine component for reducing the silver oxide layer of an image area, (b) a quaternary ammonium salt cationic activator and (c) water. The mixing ratio of the quaternary ammonium salt cationic activator is 3.0 to 20.0 wt % on the basis of the hydrazine component. The silver master plate recovery solution reduces the silver oxide layer of the image area of a silver salt photographic plate which has passed the stock time, thereby recovering the ink receptivity of the image area.

14 Claims, No Drawings

SILVER MASTER PLATE RECOVERY SOLUTION

BACKGROUND OF THE INVENTION

1. Field of the Invention

The present invention relates to a silver master plate recovery solution for recovering the ink receptivity of an image area on silver salt photographic plates for offset printing by reducing the silver oxide layer of the image area.

The silver salt photographic plate for offset printing (hereinunder referred to as "silver master plate") is a plate material produced by coating the surface of a support such as paper and plastic film with silver halide. And by electro diffusion transfer process this plate forms a smooth silver surface which constitutes a lipophilic image area for offset printing.

2. Technology Review

The surface of the silver master plate is divided into image areas and non-image areas as in a general metal photographic plate. The image area, which is a smooth metal silver surface (the polarity is theoretically zero), is lipophilic without any affinity for water. In other words, the printing area is receptive to ink. The non-image area is made of gelatin having a polarity and is hydrophilic without any affinity for oil. In other words, the non-image area is repellent to ink. In order to perform offset printing, it is necessary to maintain the polarity of the image areas in a low state and the polarity of the non-image areas in a high state.

The silver surface, which constitutes an image area on a silver master plate, begins to be oxidized immediately after plate making. Since silver oxide has a high polarity, the polarity of the oxidized image area becomes too high to maintain the lipophilic nature of the image area. As a result, the sensitivity to ink is lowered, there is a possibility of causing troubles such as non-uniformity of printing on a printed matter.

Accordingly, the guaranteed stock life of a conventional silver master plate is substantially 8 hours, which brings about the following problems:

(1) the operation of offset printing is troublesomely restricted by time, and (2) a silver master plate which has passed the stock life becomes unusable and is discarded.

It is considered that since such troubles are caused by the silver oxide layer in the image area, they will be eliminated by reducing the silver oxide layer by a reducing agent (silver master plate recovery solution).

However, no silver master plate recovery solution which recovers the lipophilic nature of the image area by reducing the silver oxide layer has been known.

This is because no conventional reducing agent can satisfy the following conditions (a), (b) and (c):

(a) To have a reducing ability in the pH range of 3 to 6.

In performing offset printing, it is inevitable that ink and water (fountain solution) are kneaded at a high speed by various rollers on the silver master plate. At this time, if the pH value of the fountain solution on the silver master plate is too high, the ink on the plate would be saponificated into a state of being compatible with water, namely, being emulsified. On the other hand, if the pH value of the fountain solution on the silver master plate is too low, there is a possibility of causing a phenomenon of roller stripping (ink fails to adhere to and distribute uniformly on the metal rollers) or chalking (ink pigment is not properly bound to the paper and can be easily ruffed off). It is therefore generally necessary to adjust the pH value of the dampening water on the silver master plate within the range of 3 to 6.

(b) To have a equivalent reducing ability in the pH range of 3 to 6.

It is difficult to fix the pH value of the fountain solution in a practical offset printing operation. Therefore, if the reducing ability of a reducing agent is controlled by the variation of the pH value of the print-immersing water, the reducing agent is not suitable for the practical offset printing.

(c) Not to make the image area (silver surface) porous after reduction.

According to the investigation undertaken by the present inventors, an aqueous hydrazine solution has been selected as a silver master plate recovery solution that satisfies the conditions (a) and (b). However, when the silver oxide layer on an image area is reduced by hydrazine, the surface of the image area becomes porous. The surface then physically produces a polarity and, as a result, water is physically adsorbed on the surface of the image area. In other words, the lipophilic nature (receptivity to ink) of the image area is lowered.

SUMMARY OF THE INVENTION

An object of this invention is to provide a silver master plate recovery solution which will recover the lipophilic nature of an image area on a silver master plate which has passed the stock life by reducing the image area.

Another object of the present invention is to provide a silver master plate recovery solution which does not exert any deleterious influence on the gelatin layer on a non-image area and the unoxidized silver surface of an image area at the time of reducing the image area on a silver master plate which has passed the stock life.

These objects are achieved by the present invention, which provides a silver master plate recovery solution containing 3.0 to 20.0 wt % of a quaternary ammonium salt cationic activator on the basis of hydrazine, which is a component of a reducing agent.

DETAILED DESCRIPTION OF THE INVENTION

The present invention will be explained in detail hereinunder.

(1) A hydrazine component has a reducing ability to silver oxide in the pH range of 3 to 6 and even when the pH value varies within this range, as described above.

Such a hydrazine component is dissolved in a solution in the form of hydrazine or an acid salt or a hydrate of hydrazine. As examples of an acid salt of hydrazine, there are inorganic acid salts such as hydrazine sulfate, hydrazine hydrochloride and organic acid salts such as hydrazine acetate, hydrazine oxalate.

The mixing ratio of hydrazine is preferably 1.0 to 3.5 wt % based on the total amount of solution. It is 1.2 to 3.0 wt % is more preferable. In case of less than 1.0 wt %, reduction, namely the silver master plate recovery operation takes much time, while if it exceeds 3.5 wt %, there is a possibility of causing scumming on the non-image areas of a silver master plate.

(2) A quaternary ammonium salt cationic activator is represented by the following general formula:

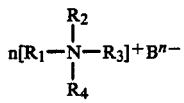

wherein $R_1$, $R_2$, $R_3$ and $R_4$ represent the same or different alkyl groups having 1 to 20 carbon atoms; B represents an inorganic acid group such as chlorine, a sulfate group, or an organic acid group such as an acetate group, oxalic group, propionate group, butyrate group, benzoate group and phthalate group; and n represents an atomic value or a radical number of 1 to 2.

In other words, $B^{n-}$ represents an inorganic anion such as chloride ion, sulfate ion, or an organic anion such as acetae ion, oxalic ion, propionate ion, butyrate ion, benzoate ion and phthalate ion.

The cationic activator enters minute pores produced on the surface of an image area and the long-chain portions of the above formula structure are arranged on the surface in alignment with each other, thereby lowering the polarity of the surface of the image area and recovering lopophilic nature of the surface of the image area.

The desirable mixing ratio of the cation activator is 3.0 to 20.0 wt % based on a hydrazine component, but 5.0 to 10.0 wt % is more desirable. If the mixing ratio of the cation activator is less than 3.0 wt %, all the minute pore on the image area can not be filled. On the other hand, if it exceeds 20.0 wt %, a part of the cationic activator remains in the image area to cause scumming.

The mixing ratio of the cationic activator is 0.1 to 0.3 wt % based on the total amount of solution.

(3) It is possible to add, if necessary, (a) a gelatin layer reinforcing agent such as a strong electrolyte which does not deteriorate silver on the image area, e.g., ammonium chloride, sodium chloride, potassium chloride, ammonium sulfate, sodium sulfate and potassium sulfate, and a lower alcohol, in order to reinforce the gelatin layer of a non-image area.

(b) a moisture absorption improver such as a saccharide and a polyvalent alcohol, in order to improve the moisture absorption of the gelatin layer, and (c) a starching agent, wetting agent, antiseptic, interfacial tension regulator, dye, etc.

EXAMPLES

Examples and Comparative Examples will be explained hereinunder.

Solutions having a composition shown in Table 1 or 2 were partially applied to a silver master plate which had been exposed to air for 350 hours after plate making process. Each solution was applied to the silver master plate by impregnating cotton with the solution and wiping the surface of the silver master plate.

In Tables 1 and 2, Arcurd is a trade name of a cationic activator produced by Lion Fat and Oil Co., Ltd., and an experimental product is a cationic activator prepared by the present inventors. The structural formula of each of the cationic activators is shown in the following. The values in the brackets represent the concentrations (wt %) of the respective cationic activators (aqueous solutions).

(Examples 1 to 4) Arcurd 2C - 75

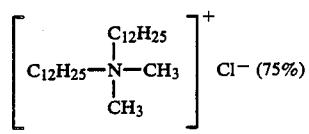

(Example 5) Arcurd 2HT - 75

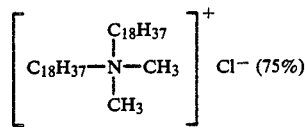

(Example 6) Arcurd 12 - 50

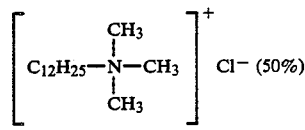

(Example 7) Arcurd T - 800

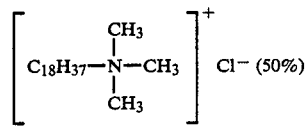

(Example 8) Arcurd 16 - 50

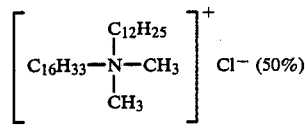

(Example 9) Experimental product - 1

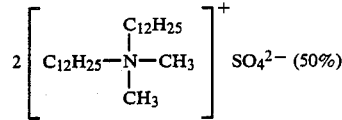

(Example 10) Experimental product - 2

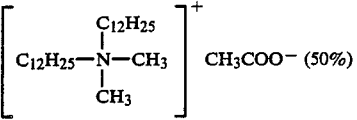

The mixing ratio (wt %) of the cationic activator in Table 1 and 2 is shown by the sheer weight thereof (water content is eliminated from the commercial or experimental product). For example, Arcurd 2C-75 is an aqueous 75% solution. The mixing ratio of Arcurd 2C-75 itself in Example 1 is $0.15 \div 0.75 = 0.2$ (wt %).

The mixing ratio of hydrazine is also shown by the sheer weight.

Each solution shown in Tables 1 and 2 was applied to a silver master plate, and immediately thereafter, the silver master plate was set in an offset printing machine Besty 1800 CD (trade name: produced by Toko Inc.) to print sheets of alkali paper having an ash content of 20% (produced by Hokuetsu Paper Mills, Ltd.) with a black ink, Master Black N (trade name: produced by Nikken Chemical Laboratory Co., Ltd.).

A printed image was visually observed from the start of printing operation at the portion of a printed matter which correspond to the silver master plate with the solution in Example applied thereto. On the 25th printed sheet, a clear image free from scumming was obtained, and thereafter the printed images were continuously clear. A printed image was also visually observed from the start of printing operation at the portion of a printed matter which corresponded to the silver master plate with the solution is Comparative Example applied thereto. In Comparative Examples 1

When a silver master plate within the stock time was used, a clear printed image was also obtained, ordinarily, on the 25th paper from the start of printing.

No scumming was caused on a printed matter. This is because the solution of the present invention does not exert any deleterious influence on the gelatin layer and the unoixdized silver surface of a non-image area.

TABLE 1

|  | Example 1 | Comparative Example 1 | Comparative Example 2 | Comparative Example 3 | Example 2 | Example 3 |
| --- | --- | --- | --- | --- | --- | --- |
| Arcurd 2C-75 | 0.15 |  | 0.03 | 0.37 | 0.15 | 0.225 |
| Hydrazine | 1.47 | 1.47 | 1.47 | 1.47 | 1.47 | 2.88 |
| Hydrochloric acid | 6.0 | 6.0 | 6.0 | 6.0 | 6.0 |  |
| Glacial acetic acid |  |  |  |  |  | 10.0 |
| Ethylene glycol |  |  |  |  | 4.0 |  |
| Polyethylene glycol |  |  |  |  | 4.0 | 65.2 |
| Ethanol |  |  |  |  | 50.0 |  |
| Water | balance | balance | balance | balance | balance | balance |
| Cationic activator Hydrazine | 1.102 | 0 | 0.02 | 0.25 | 0.102 | 0.078 |
| Results | *1 | *2 | *2 | *3 | *1 | *1 |

*1 After printing the first 24 sheets, clear images were continuously obtained.
*2 The receptivity to ink was poor.
*3 Scumming was produced.
(Note) The mixing ratio of each component is shown by wt %.

TABLE 2

|  | Example 4 | Example 5 | Example 6 | Example 7 | Example 8 | Example 9 | Example 10 | Example 11 |
| --- | --- | --- | --- | --- | --- | --- | --- | --- |
| Arcurd 2C-75 | 0.188 |  |  |  |  |  |  | 0.125 |
| Arcurd 2HT-75 |  | 0.188 |  |  |  |  |  | 0.063 |
| Arcurd 12-50 |  |  | 0.188 |  |  |  |  |  |
| Arcurd T-800 |  |  |  | 0.188 |  |  |  |  |
| Arcurd 16-50 |  |  |  |  | 0.188 |  |  |  |
| Experimental product-1 |  |  |  |  |  | 0.188 |  |  |
| Experimental product-2 |  |  |  |  |  |  | 0.188 |  |
| Hydrazine | 2.4 | 2.4 | 2.4 | 2.4 | 2.4 | 2.4 | 2.4 | 2.4 |
| Glycerin | 54.3 | 54.3 | 54.3 | 54.3 | 54.3 | 54.3 | 54.3 | 54.3 |
| Glacial acetic acid | 8.3 | 8.3 | 8.3 | 8.3 | 8.3 | 8.3 | 8.3 | 8.3 |
| Ethanol | 16.7 | 16.7 | 16.7 | 16.7 | 16.7 | 16.7 | 16.7 | 16.7 |
| Water | balance | balance | balance | balance | balance | balance | balance | balance |
| Cationic activator Hydrazine | 0.078 | 0.078 | 0.078 | 0.078 | 0.078 | 0.078 | 0.078 | 0.078 |
| Results | After printing the first 24 sheets, clear images were continuously obtained. | | | | | | | |

(Note) The mixing ratio of each component is chown by wt %.

and 2, however, since the receptivity to ink was poor, no clear image was obtained even after 25 sheets had been printed. It was not until more than 100 sheets were printed that a clear printed image was obtained. On the other hand, in Comparative Example 3, scumming was caused and the scumming did not disappear even after 50 sheets were printed.

No printed image was visually observed at the portion of a printed matter which corresponded to the silver master plate with no solution applied thereto even after 50 sheets, much less 25 sheets, had been printed. Although a printed image was observed on and after about the 150th sheet, the printed image did not become clear even after 200 sheets had been printed.

What is claimed is:

1. A silver master plate recovery solution for recovering the ink receptivity of an image area on a silver salt photographic plate for offset printing by reducing the silver oxide layer of said image area, said silver master plate recovery solution comprising:
    (a) a hydrazine component for reducing said silver oxide layer of said image area;
    (b) a quaternary ammonium salt cationic activator which enters the minute pores on said image area to lower the polarity of said image area which had been made porous by said hydrazine component; and
    (c) water.

2. A silver master plate recovery solution as defined in claim 1, wherein the mixing ratio of said hydrazine component is 1.0 to 3.5 wt % on the basis of the total amount of said silver master plate recovery solution.

3. A silver master plate recovery solution as defined in claim 1, wherein the mixing ratio of said hydrazine component is 1.2 to 3.0 wt % on the basis of the total amount of said silver master plate recovery solution.

4. A silver master plate recovery solution as defined in claim 1, wherein the mixing ratio of said quaternary ammonium salt cationic activator is 3.0 to 20.0 wt % on the basis of said hydrazine component.

5. A silver master plate recovery solution as defined in claim 1, wherein the mixing ratio of said quaternary ammonium salt cationic activator is 5.0 to 10.0 wt % on the basis of said hydrazine component.

6. A silver master plate recovery solution as defined in claim 1, wherein said quaternary ammonium salt cationic activator is represented by the following general formula:

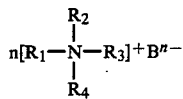

wherein $R_1$, $R_2$, $R_3$ and $R_4$ represent the same or different alkyl groups having 1 to 20 carbon atoms, B represents an acid group, and n represents an atomic value or a radical number of 1 to 2.

7. A silver master plate recovery solution as defined in claim 6, wherein $B^{n-}$ represent an inorganic anion.

8. A silver master plate recovery solution as defined in claim 7, wherein an inorganic anion is selected from the group consisting of chloride ion and sulfate ion.

9. A silver master plate recovery solution as defined in claim 6, wherein $B^{n-}$ represent an organic anion.

10. A silver master plate recovery solution as defined in claim 9, wherein an organic anion is selected from the group consisting of acetae ion, oxalic ion, propionate ion, butyrate ion, benzoate ion and phthalate ion.

11. A silver master plate recovery solution as defined in claim 1, which further comprises at least one additive selected from the group consisting of a gelatin layer reinforcing agent, improver of the moisture absorption of said gelatin layer, starching agent, wetting agent, antiseptic, interfacial tension regulator and dye.

12. A silver master plate recovery solution as defined in claim 11, wherein said at least one additive is a gelatin layer reinforcing agent selected from the group consisting of ammonium chloride, sodium chloride, potassium chloride, ammonium sulfate, sodium sulfate, potassium sulfate and a lower alcohol.

13. A silver master plate recovery solution as defined in claim 11, wherein said at least one additive is an improver of the moisture absorption of said gelatin layer selected from the group consisting of a saccharide and a polyvalent alcohol.

14. A silver master plate recovery solution for recovering the ink receptivity of an image area on a silver salt photographic plate for offset printing by reducing the silver oxide layer of said image area, said silver master plate recovery solution, essentially consisiting of:
(a) a hydrazine component for reducing said silver oxide layer of said image area;
(b) a quaternary ammonium salt cationic activator which enters the minute pores on said image area to lower the polarity of said image area which had been made porous by said hydrazine component; and
(c) water.

* * * * *